United States Patent
Chaney et al.

(10) Patent No.: US 10,672,634 B2
(45) Date of Patent: *Jun. 2, 2020

(54) EMBEDDED FEATURES FOR INTERLOCKS USING ADDITIVE MANUFACTURING

(71) Applicant: Varian Semiconductor Equipment Associates, Inc., Gloucester, MA (US)

(72) Inventors: Craig R. Chaney, Gloucester, MA (US); Adam M. McLaughlin, Merrimac, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/244,623

(22) Filed: Jan. 10, 2019

(65) Prior Publication Data

US 2019/0252226 A1    Aug. 15, 2019

Related U.S. Application Data

(63) Continuation of application No. 15/894,436, filed on Feb. 12, 2018, now Pat. No. 10,217,654.

(51) Int. Cl.
*H01L 21/67* (2006.01)
*C23C 14/48* (2006.01)
(Continued)

(52) U.S. Cl.
CPC ........ *H01L 21/67294* (2013.01); *C23C 14/48* (2013.01); *G08B 21/18* (2013.01); *H01J 37/16* (2013.01); *H01J 37/3171* (2013.01); *H01L 21/67213* (2013.01); *H01L 21/67288* (2013.01); *B33Y 80/00* (2014.12); *H01J 2237/2482* (2013.01)

(58) Field of Classification Search
CPC ... H01L 21/67294; C23C 14/48; G08B 21/18; B33Y 80/00; H01J 37/3171
USPC .............................. 250/492.1, 492.2, 492.21
See application file for complete search history.

(56) References Cited

U.S. PATENT DOCUMENTS 4,747,048 A    5/1988 Mueller
5,013,908 A    5/1991 Chang
(Continued)

FOREIGN PATENT DOCUMENTS

JP    10-27568 A    1/1998
WO    2008/058246 A2    5/2008

OTHER PUBLICATIONS

International Search Report and Written Opinion dated May 7, 2019 in corresponding PCT application No. PCT/US2019/013014.

*Primary Examiner* — Nicole M Ippolito
*Assistant Examiner* — Hanway Chang
(74) *Attorney, Agent, or Firm* — Nields, Lemack & Frame, LLC

(57) ABSTRACT

The present disclosure describes a method and apparatus for determining whether components in a semiconductor manufacturing system are authorized for use in that system. By embedding an identification feature in the component, it is possible for a controller to determine whether that component is qualified for use in the system. Upon detection of an unauthorized component, the system may alert the user or, in certain embodiments, stop operating of the system. This identification feature is embedded in a component by using an additive manufacturing process that allows the identification feature to be embedded in the component without subjecting the identification feature to extreme temperatures.

17 Claims, 7 Drawing Sheets

(51) Int. Cl.
*G08B 21/18* (2006.01)
*H01J 37/317* (2006.01)
*H01J 37/16* (2006.01)
*B33Y 80/00* (2015.01)

(56) References Cited

U.S. PATENT DOCUMENTS

| | | |
|---|---|---|
| 10,217,654 B1 | 2/2019 | Chaney et al. |
| 2015/0200073 A1 | 7/2015 | Jen et al. |
| 2017/0338075 A1 | 11/2017 | Byl et al. |

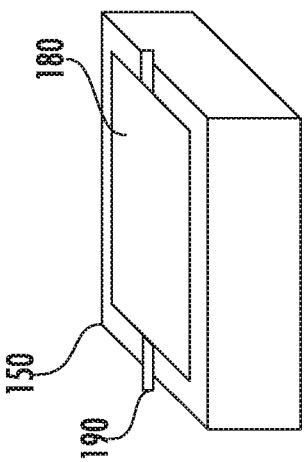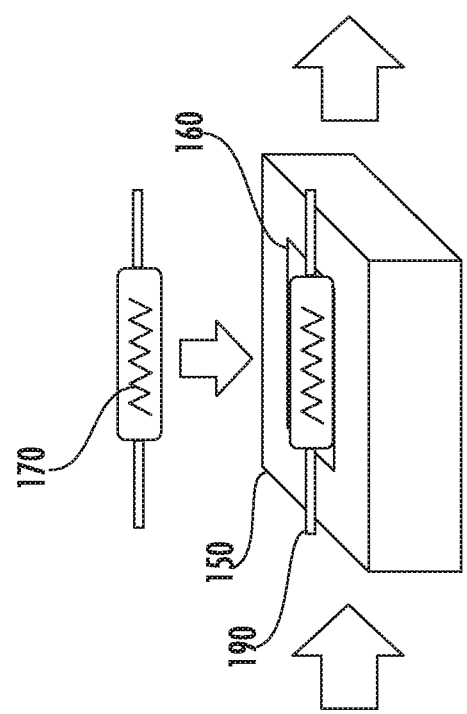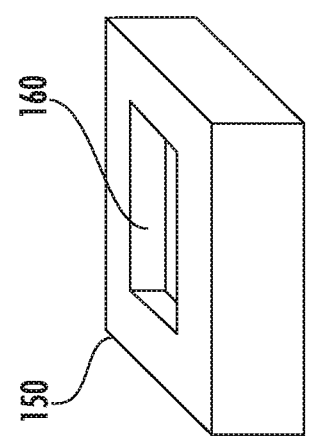

EMBEDDED FEATURES FOR INTERLOCKS USING ADDITIVE MANUFACTURING

This application is a continuation of U.S. patent application Ser. No. 15/894,436 filed Feb. 12, 2018, the disclosure of which is incorporated herein by reference in its entirety.

FIELD

The present disclosure is in the technical field of additive manufacturing, and more specifically the manufacture of components having interlocks and embedded identification features.

BACKGROUND

Semiconductor devices are manufactured using complex semiconductor processing systems, comprising a plurality of different components. Semiconductor yield and performance is reliant on the interaction and cooperation of these components. For example, if one component is below target specifications, the resulting semiconductor devices may be adversely affected.

Consequently, equipment manufacturers attempt to provide high quality components for use in these complex semiconductor processing systems. The equipment manufacturers then specify overall system performance based on the specifications of each component.

Some of the components used in these complex semiconductor systems may wear out due to usage or wearout. Often times, replacement parts may be available from third-party vendors. Unfortunately, some of these third party components may not be made to the same specifications as the original components. Consequently, there may be a degradation in performance, efficiency or yield due to these inferior third-party components.

Unfortunately, in most semiconductor processing systems, it is not possible to determine whether the system only contains components that meet the desired specifications. Thus, it may be possible that after a component is replaced, the system no longer performs at its specified level. As a result of this, the original manufacturer may be asked to launch product support efforts to address these perceived quality or performance issues.

It would be beneficial if there were a method of determining whether the components used in a semiconductor manufacturing system had been qualified for use on that system. Further, it would be advantageous if this method was performed using some identification feature that was embedded in the component.

SUMMARY

The present disclosure describes a method and apparatus for determining whether components in a semiconductor manufacturing system are authorized for use in that system. By embedding an identification feature in the component, it is possible for a controller to determine whether that component is qualified for use in the system. Upon detection of an unauthorized component, the system may alert the user, alter the operation of the system, or, in certain embodiments, stop operating of the system. This identification feature is embedded in a component by using an additive manufacturing process that allows the identification feature to be embedded in the component without subjecting the identification feature to extreme temperatures.

According to one embodiment, an ion implantation system is disclosed. The ion implantation system comprises a controller in communication with a receiver; and a component having a cavity and an identification feature disposed in the cavity; wherein the controller outputs a signal which is received and modified by the identification feature before being transmitted to the receiver. In certain embodiments, the signal comprises a light signal, and the identification feature modifies a frequency, phase or amplitude of the signal. In certain embodiments, the signal comprises an analog signal, and the identification feature modifies a frequency, phase or amplitude of the signal. In certain embodiments, the signal comprises a digital signal, and the identification feature modifies a frequency, duty cycle or phase of the signal. In certain embodiments, the signal comprises a digital signal, and the identification feature modifies the signal by appending a unique identification to the signal.

According to another embodiment, an ion implantation system is disclosed. The ion implantation system comprises a controller in communication with a receiver; and a component having a cavity and an identification feature disposed in the cavity; wherein the controller outputs a signal which is received and modified by the identification feature before being transmitted to the receiver; and wherein the controller analyzes the signal received by the receiver to determine a characteristic of the component. In certain embodiments, the ion implantation system comprises a second component having a cavity and a second identification feature, wherein the signal output from the identification feature is received and modified by the second identification feature before being received by the receiver. In certain embodiments, the characteristic comprises whether the component is authorized to operate on the ion implantation system. In some embodiments, the controller performs an action based on the characteristic. The action may comprise a modification of at least one operating parameter of the ion implantation system. The action may comprise actuating an alert to an operator.

According to another embodiment, an ion implantation system is disclosed. The ion implantation system comprises at least one component comprising a cavity, and an identification feature; wherein the cavity comprises at least one passageway between an interior of the cavity and an exterior of the component, and wherein the identification feature is disposed in the cavity and a top of the cavity is sealed with metal strips. In certain embodiments, the identification feature is larger than the passageway in at least one dimension. In certain embodiments, the ion implantation system comprises a second component having a second identification feature, wherein the identification feature is in communication with the second identification feature. In certain embodiments, the identification feature comprises an amplitude varying element, a frequency varying element or a phase varying element. In some embodiments, the top of the cavity is sealed using ultrasonic additive manufacturing.

BRIEF DESCRIPTION OF THE DRAWINGS

For a better understanding of the present disclosure, reference is made to the accompanying drawings, in which like elements are referenced with like numerals, and in which:

FIGS. 2A-2C illustrate the fabrication of a component having an embedded identification feature according to a second embodiment;

DETAILED DESCRIPTION

As described above, a semiconductor manufacturing system may be constructed of a plurality of components. An identification feature may be embedded in any or all of these components to allow the system to identify the component. The identification feature may be any element that may be used to identify the component. In certain embodiments, the component may be an annular ring, such as a gasket, flange or other similar component. In other embodiments, the component may be rectangular in shape. Of course, the components may be any other shape as well.

Figure 1A:
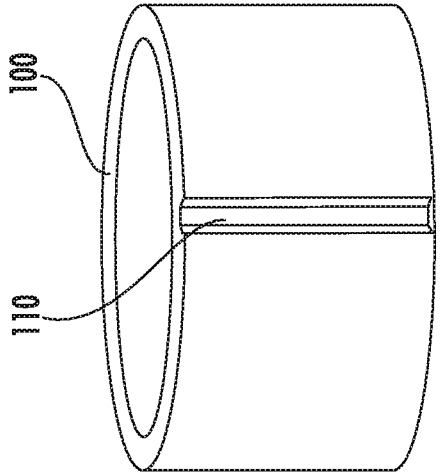
FIGS. 1A-1C illustrate the fabrication of a component having an embedded identification feature according to one embodiment.
Figure 1B:
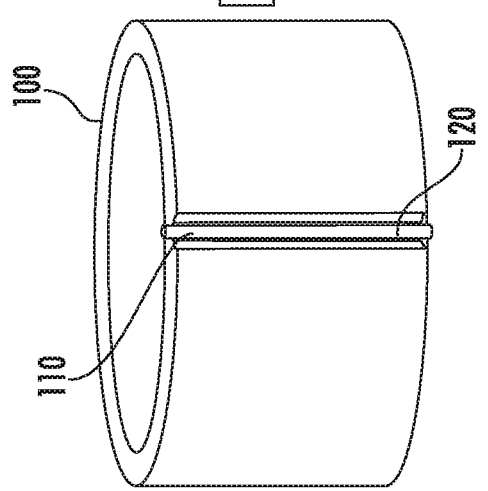
Figure 1C:
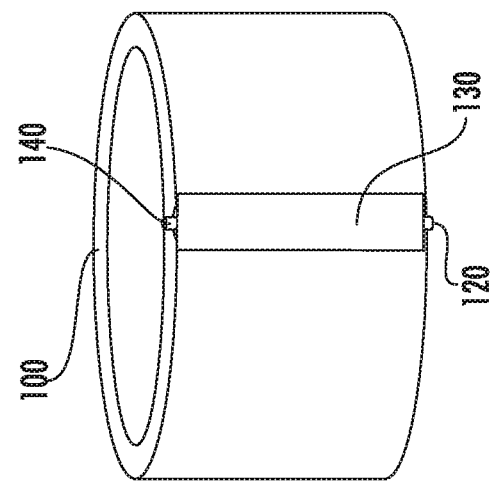

FIGS. 1A-1C illustrate a sequence used to embed an identification feature in a component. FIG. 1A shows a component 100 that is shaped as an annular ring or hollow cylinder. First, as shown in FIG. 1A, a cavity 110 may be subtractively introduced into the sidewall of the component 100. This cavity 110 may be in the form of a channel in some embodiments. This cavity 110 may be made by grinding, etching or any other suitable process. Further, the cavity 110 may be any desired width and depth. In other embodiments, the component 100 may have been created using an additive manufacturing. In this embodiment, the cavity 110 may be created as the component 100 is being grown. In yet other embodiments, the component 100 may be created using a cast or mold. In this embodiment, the cavity 110 may be created during the casting or molding process. In all embodiments, a component 100 having a cavity 110 is created.

After the component 100 with the cavity 110 is created, an identification feature 120, such as a fiberoptic cable, may be inserted in the cavity 110. While a fiberoptic cable is shown, it is understood that any other type of identification feature may be inserted. The identification feature may be a printed circuit board, an electrical circuit, one or more light emitters, one or more sensors, an electrical conduit or any combination of these elements.

After the identification feature 120 has been inserted into the cavity 110, the top of the cavity 110 is sealed. This may be done using an additive manufacturing technique. In one embodiment, the component 100 may be made of metal and an ultrasonic additive manufacturing process may be employed. In this process, a layer of metal, which may be a metal strip 130, is disposed over the cavity 110. The metal strip 130 may be wider than the width of the cavity 110 in some embodiment. The metal strip 130 is deposited on the component 100 using an apparatus that includes one or more transducers that emit ultrasonic waves toward a horn. The metal strip 130 is in contact with the horn, and is thus subjected to the ultrasonic waves as well as applied pressure. These ultrasonic waves serve to weld the metal strip 130 to the component 100 without the use of heat. In some embodiments, a plurality of metal strips 130 are welded to the component 100. Thus, even identification features that are sensitive to thermal extremes may be embedded in the cavity 110 without damage. While the cavity 110 is covered by the metal strip 130, a passage 140 remains on at least one end of the cavity 110. In certain embodiments, a passage 140 remains on both ends of the cavity 110. In this way, a conduit, such as a fiberoptic cable or an electrical wire may be routed through the cavity 110 and exit on both ends of the cavity 110. In certain embodiments, the identification feature 120 disposed in the cavity 110 is larger than the passage 140 in at least one dimension, such that the identification feature 120 cannot be inserted or removed from the cavity 110 once the metal strips 130 are welded in place.

While FIGS. 1A-1C show a component 100 with an identification feature 120 disposed in a cavity 110 that resembles a channel, other embodiments are also possible. FIGS. 2A-2C show a component 150 in the form of a rectangular prism that includes a cavity 160. This cavity 160 may be created in a number of ways. For example, the cavity 160 may be created through a subtractive manufacturing technique, such as grinding, etching or another suitable process. Alternatively, the component 150 may be fabricated by molding, where the molding includes a protrusion that creates the cavity 160. In other embodiments, the component 150 may have been created using an additive manufacturing. In this embodiment, the cavity 160 may be created as the component 150 is being grown. In one embodiment, the component 150 may be made of metal.

In FIG. 2B, an identification feature 170 is disposed in the cavity 160. Like identification feature 120, identification feature 170 may be a fiberoptic cable, a printed circuit board, an electrical circuit, one or more light emitters, one or more sensors, an electrical conduit or any combination of these elements. Further, a passage 190 is shown which connects the cavity 160 to an exterior surface of the component 150. This passage 190 may have at least one dimension that is smaller than a corresponding dimension of the cavity 160.

In FIG. 2C, metal strips 180 are welded over the cavity 160, such as through the use of ultrasonic additive manufacturing (UAM). As described above, UAM welds without the use of heat and therefore, the identification feature 170 is not damaged by the welding process. Further, if the identification feature 170 is larger in at least one dimension than the passage 190, it is not possible to remove the identification feature 170 from the component 150 without removing the metal strips 180. The cavity 160 may be in communication with the exterior of the component through one or more passages 190. For example, in one embodiment, shown in FIG. 2C, passages 190 are disposed on opposite sides of the cavity 160. However, in other embodiments, there may be only one passage 190. In yet other embodiments, there may be two passages 190, but they may be disposed on adjacent sides or the same side of the component 150. In yet other embodiments, there may be more than two passages 190. Thus, the number and location of the passages 190 is not limited by this disclosure.

Further, while the figures show the passages as simply being open pathways, it is understood that a connector or other interface component may be disposed in these passages such that adjacent components and identification features may be physically connected together.

Thus, the UAM process allows an identification feature that is larger than the passage connecting that identification feature to an exterior of the component to be embedded in the interior of the component. For example, a printed circuit board having at least one dimension that is larger than the passage may be embedded in a component. Similarly, the identification feature may comprise a sensor or a light emitter having at least one dimension that is larger than the passage.

In this way, complex identification features may be embedded into components that allow complicated identification schemes. Further, the use of UAM to weld metal strips over the identification feature provides an impediment or hindrance to those attempting to copy or counterfeit the component.

The ability to create cavities in a component, place an identification feature in that cavity, and seal the top of the cavity with the identification feature inside through an ultrasonic additive manufacturing process has many applications.

Figure 3:
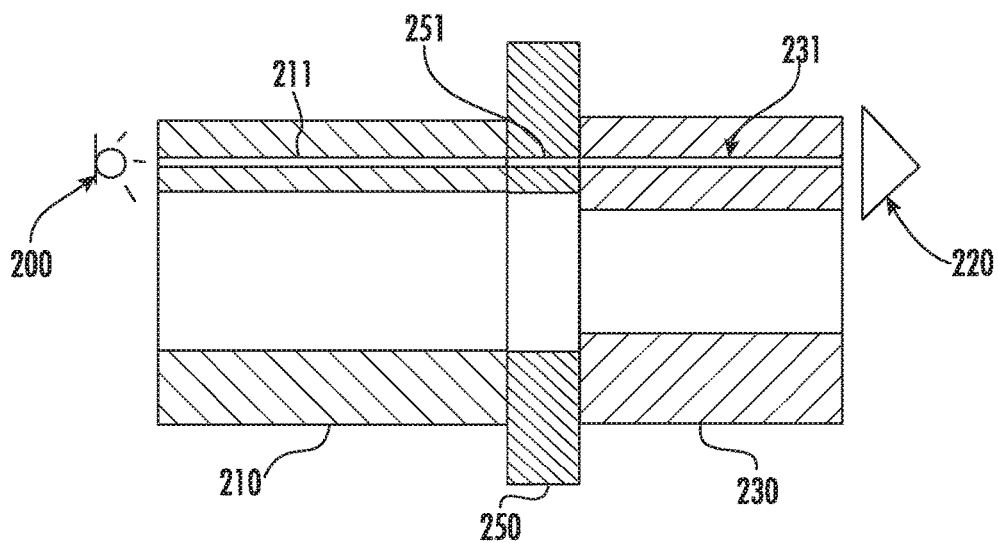
FIG. 3 shows a first embodiment of an authentication mechanism using the component shown in FIG. 1C.
Figure 4:
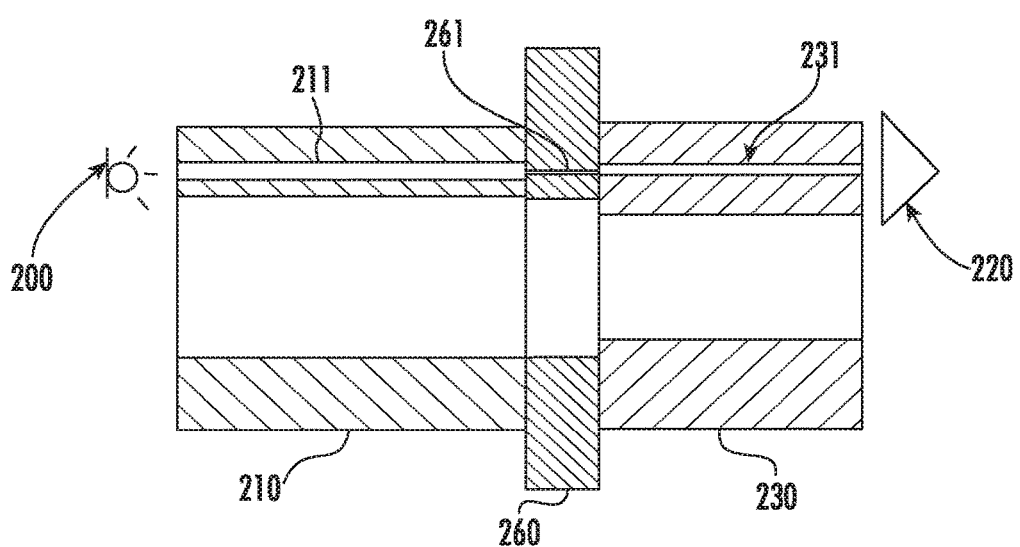
FIG. 4 shows a second embodiment of an authentication mechanism using the component shown in FIG. 1C.
Figure 5:
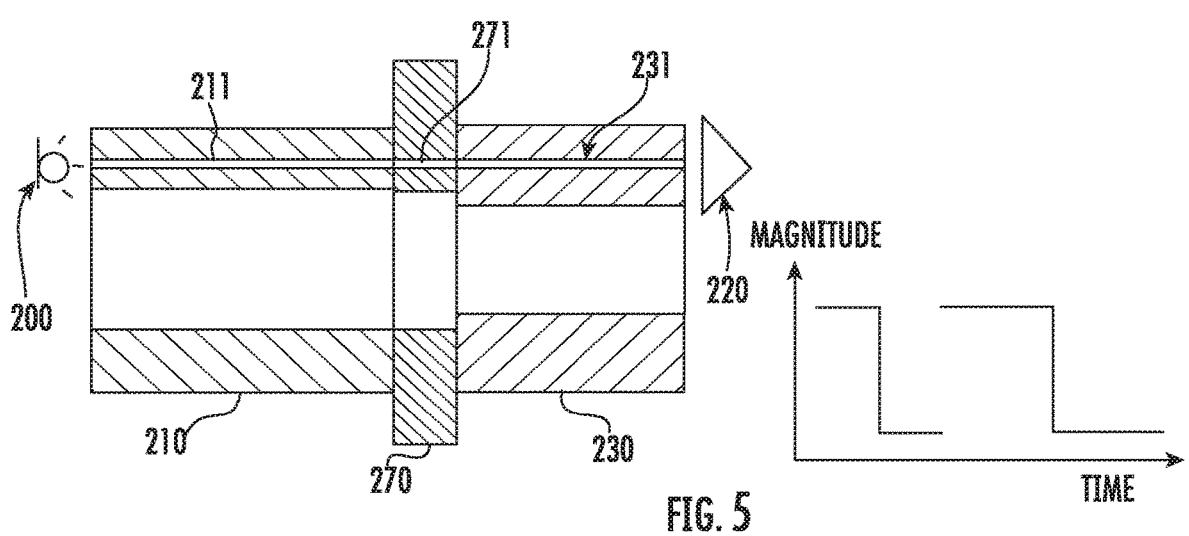
FIG. 5 shows a third embodiment of an authentication mechanism using the component shown in FIG. 1C.

FIGS. 3-5 shows various embodiments that utilize a light beam transmitted through a fiberoptic cable to determine whether a component is authorized for use in the semiconductor manufacturing system. In each embodiment, a light source 200 is used to emit a light into the fiberoptic cable 211 that is disposed in a first component 210. In each embodiment, a sensor 220 is used to capture the output of the light beam as it exits a fiberoptic cable 231 in the second component 230. It is noted that this configuration is simply for illustrative purposes. For example, the sensor 220 may be disposed in the second component 230 in some embodiments. In certain embodiments, the light source 200 may be disposed in the first component 210.

FIGS. 3-5 show three components to illustrate that the authentication mechanism can include a plurality of different components. However, the authentication mechanism may be performed using an arbitrary number of components. For example, one or both of the first component and the second component may be omitted. Alternatively, more components may also be added to the authentication mechanism.

Each of FIGS. 3-5 show a third component disposed between the first component 210 and the second component 230. In certain embodiments, the first component 210 and the second component 230 are adjacent to the third component and sandwich the third component. In each figure, the third component comprises an identification feature that serves as a portion of the authentication mechanism.

FIG. 3 shows a first embodiment of an authentication mechanism. In this embodiment, the third component 250, which is disposed between the first component 210 and the second component 230, includes an identification feature, which is a conduit 251 that connects the fiberoptic cable 211 in the first component 210 and the fiberoptic cable 231 in the second component 230. This conduit 251 may be a fiberoptic cable or another suitable conduit. In this embodiment, the light emitted from the light source 200 is to be received by the sensor 220 after passing through the first component 210, the second component 230 and the third component 250. If the sensor 220 does not detect the light, the authentication fails.

FIG. 4 shows a second embodiment of an authentication mechanism. In this embodiment, the third component 260, which is disposed between the first component 210 and the second component 230 includes an identification feature, which is an amplitude varying element 261 that is disposed between the fiberoptic cable 211 in the first component 210 and the fiberoptic cable 231 in the second component 230. This amplitude varying element 261 may attenuate the signal received from the fiberoptic cable 211. In another embodiment, this amplitude varying element 261 may amplify the signal received from the fiberoptic cable 211. In this embodiment, the light emitted from the light source 200 is to be received by the sensor 220 after passing through the first component 210, the second component 230 and the third component 260. If the sensor 220 does not detect the defined change in light amplitude, the authentication fails. While FIG. 4 shows a single component (i.e. second component 230) that attenuates or amplifies the light, the disclosure is not limited to this embodiment. Amplitude modification can occur in multiple components and may occur multiple times. In certain embodiments, the attenuation or amplification of each component is unique so that the system can determine which component does not possess the requisite identification feature.

FIG. 5 shows a third embodiment of an authentication mechanism. In this embodiment, the third component 270, which is disposed between the first component 210 and the second component 230 includes an identification feature, which is a frequency varying element 271 that is disposed between the fiberoptic cable 211 in the first component 210 and the fiberoptic cable 231 in the second component 230. This frequency varying element 271 may transform a constant light beam into a series of pulses, as shown in FIG. 5. In another embodiment, this frequency varying element 271 may modify a time-varying signal received from the fiberoptic cable 211. In this embodiment, the light emitted from the light source 200 is to be received by the sensor 220 after passing through the first component 210, the second component 230 and the third component 270. If the sensor 220 does not detect the defined change in light frequency, the authentication fails. While FIG. 5 shows a single component (i.e. second component 230) that modifies the frequency of the light beam, the disclosure is not limited to this embodiment. Frequency modification can occur in multiple components and may occur multiple times.

In other embodiments, the identification feature may be a phase varying element, which changes the phase of a receiving pulsed signal. In certain embodiments, the identification may modify one or more characteristics of the light beam, where the characteristics include amplitude, frequency and phase.

While FIGS. 3-5 show a light source 200 and a sensor 220, it is understood that other devices may be utilized. For example, instead of a light source 200 and fiberoptic cables, the authentication mechanism may utilize an analog electric signal and electrical conduits. In certain embodiments, the light source 200 and sensor 220 are replaced by analog electrical components, while the function of the identification feature is unaffected. In other words, the identification feature may be used to pass the analog signal, vary its amplitude, vary its frequency, or vary its phase.

In yet other embodiments, digital electrical signals may be passed between the components. For example, in certain embodiments, the digital electrical signals may comprise a square wave, a clock signal, a pulse train or other modulated signal. In this embodiment, the identification feature may change the frequency of the received digital signal. In certain embodiments, the identification feature may change the phase of the received digital signal. In yet other embodiments, the identification feature may modify the duty cycle of the received digital signal before transmitting it to the second component.

In other embodiments, the identification feature may include an electrical circuit or a memory storage element which is able to provide an identifier in response to a request from the semiconductor manufacturing system. For example, a request for identification may be transmitted by a controller. This request may be transmitted on a serial or parallel interface. In response, the identification feature returns a unique identifier. In another embodiment, a digital signal may be transmitted from the first component to the third component and to the second component. As each component receives the incoming signal, it appends a unique identifier to the end of the incoming signal. In this way, after the last component in the system transmits the signal back to the controller, the controller can identify all of the components in the system, as well as their physical configuration. For example, the controller may initiate the sequence by transmitting a starter symbol. The first component may receive the starter symbol, and append a first unique identifier to the end of the starter symbol. The next component may receive the digital sequence that includes a starter symbol and a first unique identifier and append a second unique identifier. This continues until all of the components have received the digital sequence and append their respective unique identifier. The controller can then parse the received digital sequence to identify each component and the order in which they are configured.

Thus, in certain embodiments, the identification features in each component are in communication with each other. In some embodiments, the identification features are connected using a cable, such as an electrical conductor or a fiberoptic cable. The components may be daisy chained together in certain embodiments. In some embodiments, connectors are disposed at or near the passages. The components are connected using conduits which attach to connectors disposed on two adjacent components. In other embodiments, the connector for one component attaches directly to the connector of the adjacent component. For example, adjacent components may be configured such that one component has a male connector, while the adjacent component utilizes a female connector. In this way, the two components can simply be pressed together to establish the connection between adjacent identification features. The connectors may be standard connectors, or may be custom made.

Figure 6:
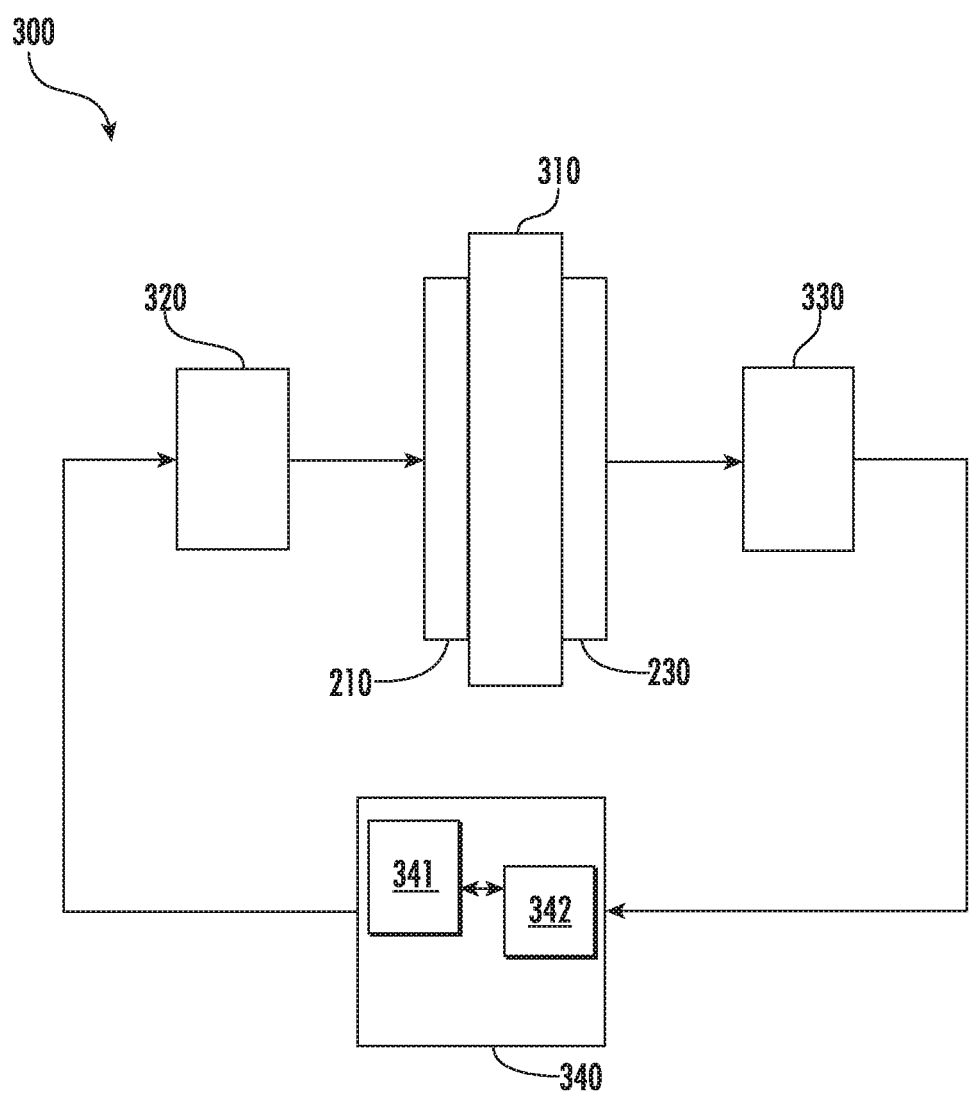
FIG. 6 shows a representative control system for a semiconductor manufacturing system.

FIG. 6 shows a simplified diagram of the control system for a representative semiconductor manufacturing system 300. The semiconductor manufacturing system 300 comprises one or more components, such as first component 210, second component 230 and third component 310. The system also includes a signal source 320. The signal source may be a light source, an analog electrical signal source or a source of digital signals. The system also comprises a signal receiver 330. The signal receiver 330 may be in communication with a controller 340. The controller 340 may comprise a processing unit 341 in communication with a storage element 342. The storage element 342 may be any non-transitory media, such as a dynamic memory (DRAM), a random access memory (RAM), a read only memory (ROM), an electrical erasable memory (EEROM), a FLASH memory, a magnetic media or an optical media. Other types of media may also be used to create the storage element 342. The storage element 342 contains instructions, which when executed by the processing unit 341, enable the controller 340 to perform the functions described herein. The processing unit 341 may be any suitable device, such as a general purpose processor, a special purpose processor, or an embedded processor.

In operation, the controller 340 may instruct the signal source 320 to output a particular signal. That signal may pass through the first component 210, the third component 310 and the second component 230. One or more of these components may manipulate or alter the signal that is output by the signal source 320. The signal is ultimately received by the signal receiver 330. This received signal is then processed, either by the signal receiver 330 or by the controller 340 to determine whether it is within acceptable parameters. If the controller 340 determines that the received signal meets these criteria, the semiconductor manufacturing system 300 operates normally. If the controller 340 determines that the received signal does not meet these criteria, the controller 340 may alert an operator of this fact. The alert may be in the form of a visual message, such as on a display device or a remote device. Alternatively, the alert may be an audible alarm. In other embodiments, the semiconductor manufacturing system 300 may not function if the controller 340 determines that the received signal does not meet the criteria.

While FIG. 6 shows the signal passing through three components, it is noted that other embodiments are also possible. For example, a separate signal source and signal receiver may be used for each respective component in the system that is to be authorized.

Figure 7:
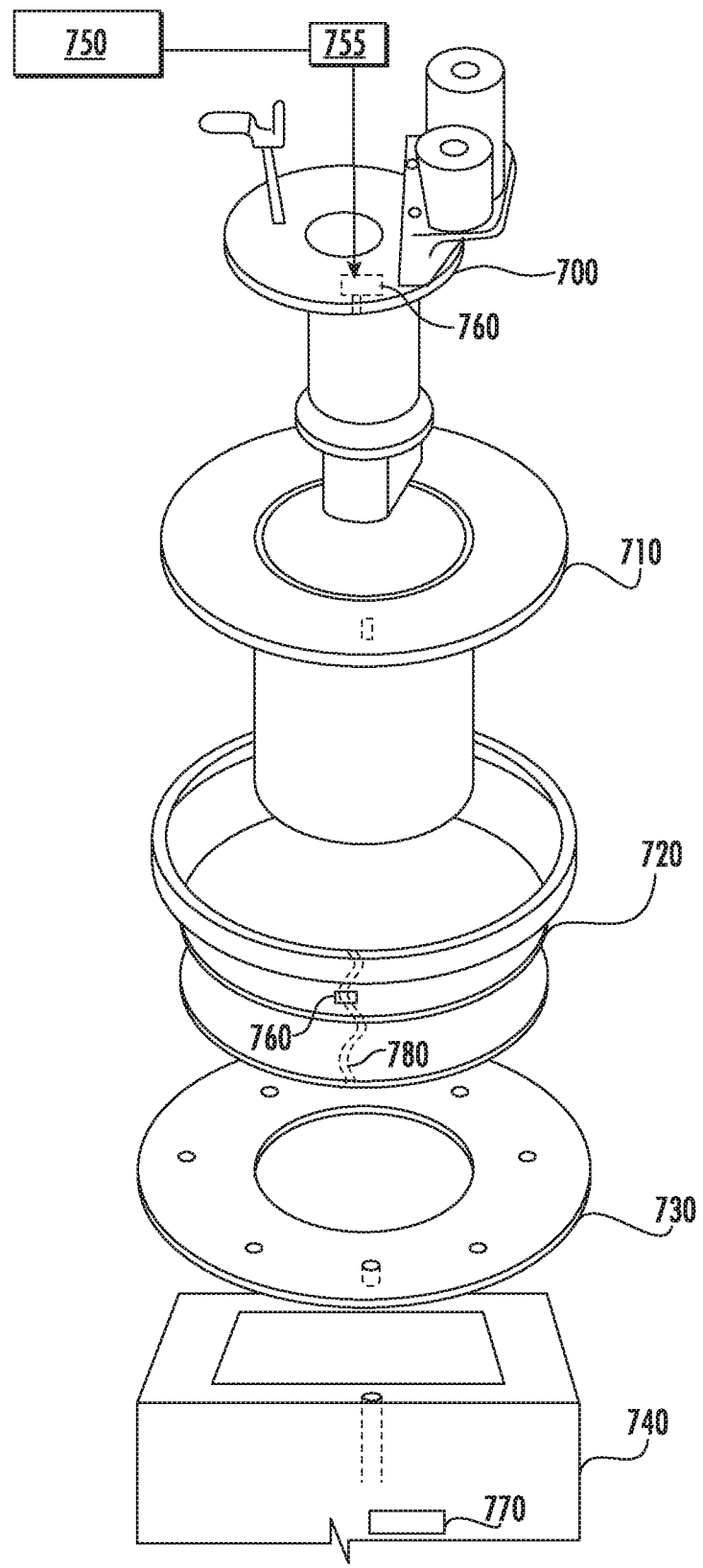
FIG. 7 shows a system with multiple components having an identification feature according to one embodiment.

FIG. 7 shows a system with multiple components having an identification feature according to one embodiment. In this configuration, there is an ion source 700, a shield bushing 710, a bushing 720, a bushing flange 730 and a source chamber 740. These components are physically arranged in this order. One or more of these components may have an identification feature 760 that is enclosed in a cavity 780 where the top of the cavity 780 was sealed using UAM. A controller 750 may be used to introduce a signal to the system. This controller 750 may comprise a processing unit in communication with a storage element. The storage element may be any non-transitory media, such as a dynamic memory (DRAM), a random access memory (RAM), a read only memory (ROM), an electrical erasable memory (EEROM), a FLASH memory, a magnetic media or an optical media. Other types of media may also be used to create the storage element. The storage element contains instructions, which when executed by the processing unit, enable the controller 750 to perform the functions described herein. The processing unit may be any suitable device, such as a general purpose processor, a special purpose processor, or an embedded processor. The controller 750 may be in communication with an output 755 which transmits the signal.

As described above, this signal may be a fiberoptic signal, an analog signal or a digital signal. This signal is transmitted between the components through the cavity disposed in each component. As described above, one or more of these components may include an identification feature 760 that modifies the signal as it is transmitted through the component. A receiver 770, which may be a light sensor or an electrical receiver, is disposed at the distal end of the pathway defined by the various cavities. The receiver 770 may be in communication with the controller 750. The controller 750 then analyzes the signal received by the receiver 770. In certain embodiments, the controller 750 compares the received signal to an expected signal in terms of amplitude, frequency, duty cycle and phase. In other embodiments, the controller may interpret the received digital signal to decode it. Based on the results of the comparison or analysis, the controller 750 may determine that one or more components is not authorized for use in the system. This determination may be made based on the received amplitude, frequency, duty cycle, or phase. Based on this analysis, the controller 750 may take one or more actions. The controller 750 may alert the operator if one or more components are not authorized for use in the system.

The controller 750 may also abort the operation of the system based on the results of the comparison or analysis.

Figure 8:
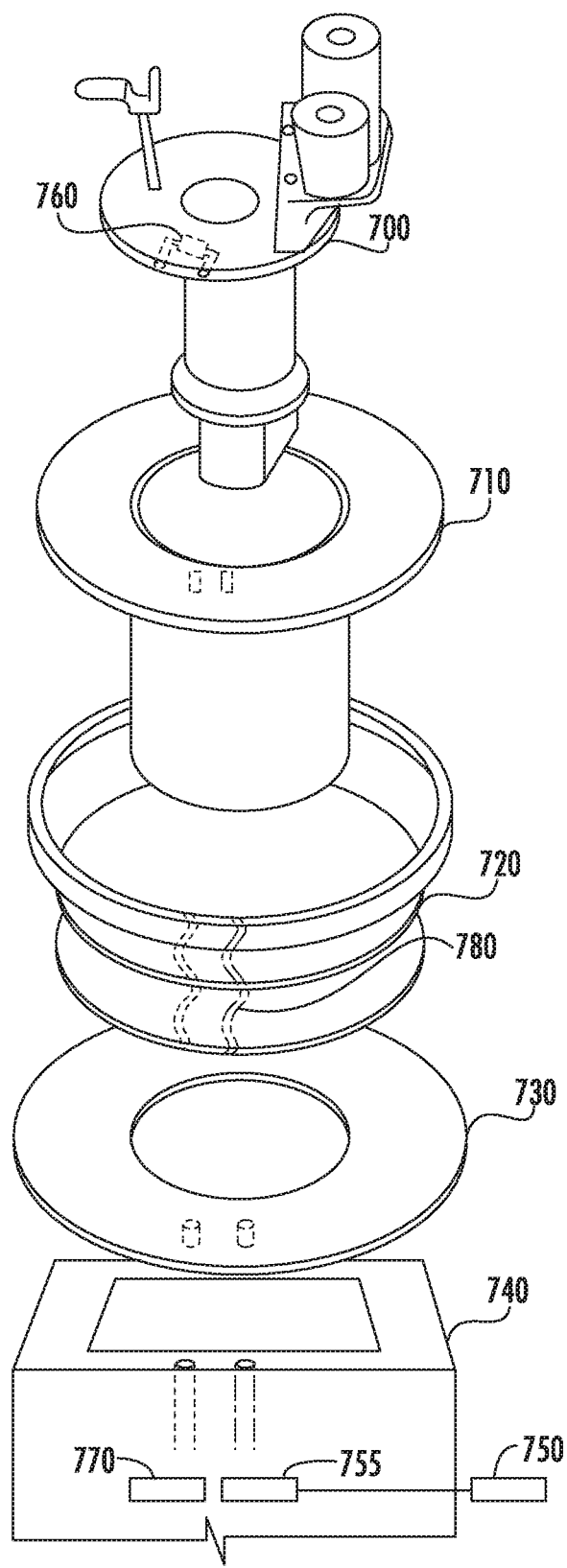
FIG. 8 shows a system with multiple components having an identification feature according to a second embodiment.

FIG. 8 shows a system with multiple components having an identification feature according to another embodiment. In this embodiment, the pathway is looped so that it begins and ends at the same location. For example, the controller 750 may be in communication with an output 755 that is proximate one component, such as the source chamber 740. The receiver 770 is also located proximate the source chamber 740. The signal travels through the source chamber 740, the bushing flange 730, the bushing 720, the shield bushing 710, and the ion source 700. The ion source 700 also outputs the signal, which then travels through the shield bushing 710, the bushing 720, the bushing flange 730, and the source chamber 740 before arriving at the receiver 770. In this embodiment, each component (except the ion source 700) has two cavities so that the signal can be looped back through the component. The ion source 700 has a single cavity that may be arranged in a U shape.

While FIGS. 6-8 show the controller as being a separate component, other embodiments are also possible. For example, the controller may reside within one of the cavities within one of the components.

Although the above disclosure describes a system where each component is authorized for the system to operate, other embodiments are also possible. For example, the controller 750 may modify one or more operating parameters of the system based on the results of the comparison or analysis.

In one embodiment, one component, such as the ion source 700 may be a replaceable component, where there are a plurality of possible ion sources that may be employed with the system. Based on the result of the comparison or analysis, the controller 750 may determine which ion source 700 has been installed. Based on the ion source, the controller 750 may change the bias and arc currents depending on the ion source that is installed. For example, if a large cathode ion source is installed, the cathode may utilize more heat to operate, so the bias current would be increased. For a small cathode source, the bias current may be significantly lower, so the controller 750 would automatically adjust these parameters depending on which ion source 700 is installed. Of course, this example is merely illustrative and other parameters may also be adjusted.

In other words, the controller 750 may perform one or more actions based on a characteristic of the component. The actions may include alerting an operator, disabling the system or modifying at least one operating parameter of the system. The characteristic of the component may include whether that component is authorized to operate on the system, or may include the identity of the component.

Figure 9:
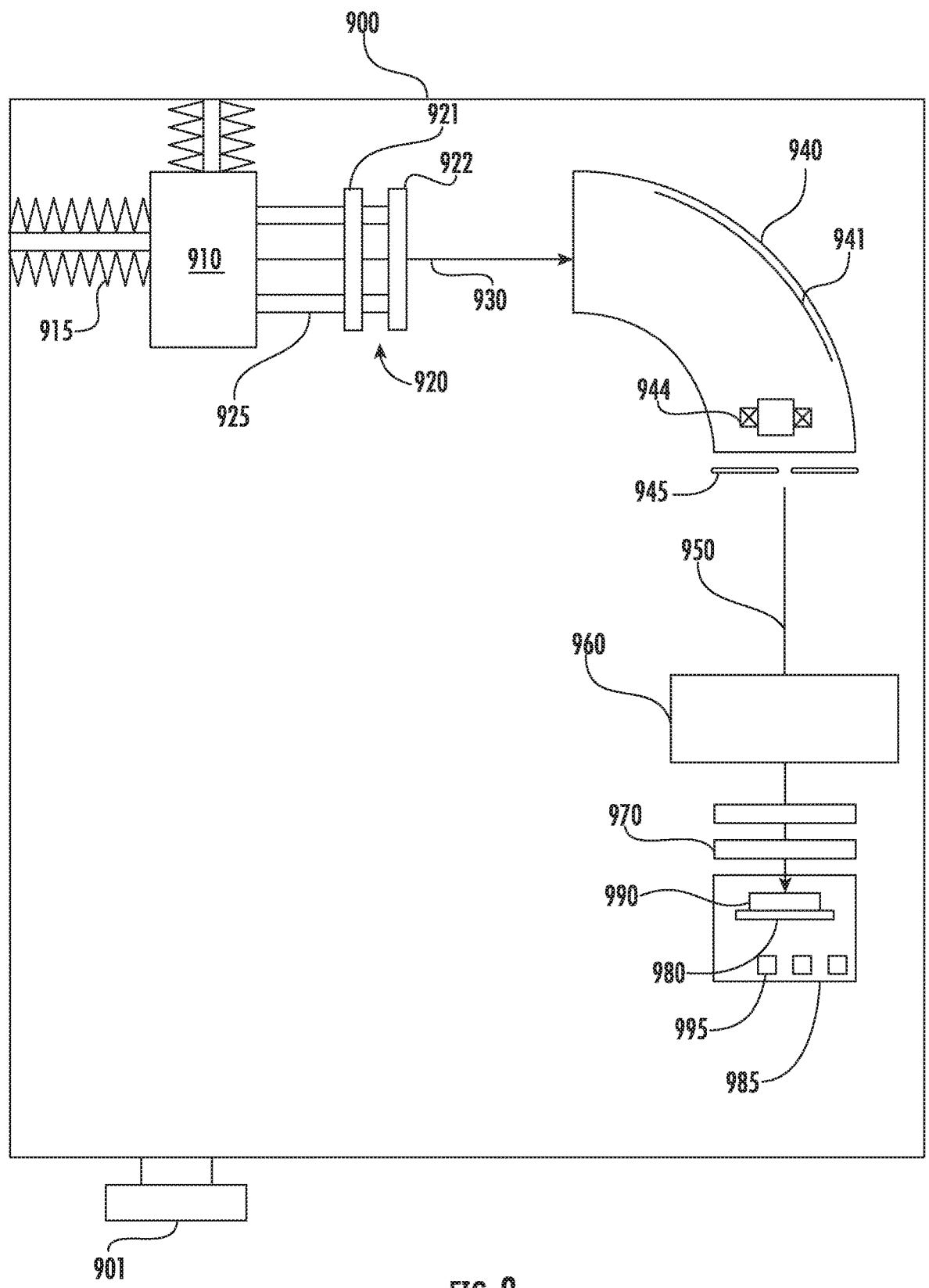
FIG. 9 shows an ion implantation system that utilizes a component having an embedded identification feature.

While FIGS. 7-8 show a portion of an ion implantation system, it is understood that other components in the ion implantation system may also include an identification feature. FIG. 9 shows an ion implantation system according to one embodiment. In one embodiment, the ion source 910 may include an indirectly heated cathode (IHC), housed within a tungsten chamber. This ion source 910 may be contained within a larger housing 900. A turbo pump 901 may be used to maintain the interior of the larger housing 900 at a desired pressure. As the ion source 910 is typically biased at a substantial voltage, it may be necessary to electrically isolate the ion source 910 from the larger housing 900. This may be achieved through the use of source bushings 915.

Outside the ion source 910 is an extraction assembly 920, made up of one or more electrodes which are appropriately biased to attract ions generated in the ion source 910. The electrodes draw these ions to, and then through the electrode. In some embodiments, there may be multiple electrodes, such as an extraction electrode 921 and a suppression electrode 922. These electrodes may be at different voltages, and therefore are electrically isolated from one another. These may be achieved through the use of an insulated manipulator assembly 925, which holds the extraction assembly 920 in place.

The extracted ion beam 930 may then enter a mass analyzer 940. One or more liners 941 may be disposed within the mass analyzer 940 or within other components. The ion beam flows through a guide tube (not shown) in the mass analyzer 940. In some embodiments, a focusing element, such as a quadrupole lens 944 or Einsel lens, may be used to focus the ion beam. A resolving aperture 945 is disposed at the output of the mass analyzer 940, which extracts only ions having the desired charge/mass ratio. The analyzed ion beam 950, which now contains only the ions of interest, is then implanted into the substrate 990, which may be mounted on a substrate support or platen 980. In some embodiments, a corrector magnet 960, and one or more acceleration or deceleration stages 970 may be employed to adjust the speed of the analyzed ion beam 950. These acceleration or deceleration stages 970 may be disposed proximate a process chamber 985. The substrate 990 and substrate support or platen 980 may be disposed in the process chamber 985. In certain embodiments, dose and Faraday cups 995 may be disposed in the process chamber 985 to measure current.

Many of these components may be equipped with a cavity where the top of the cavity is sealed using UAW and contains an identification feature. Some of these components include the ion source 910, the extraction assembly 920, the platen 980, the turbo pump 901, the mass analyzer 940, the corrector magnet 960, the acceleration or deceleration stages 970, the resolving aperture 945, the liners 941, the dose and Faraday cups 995 and the various magnets in the system.

The present system has many advantages. First, it may be advantageous to detect the presence of components in an ion implantation system that are not authorized to operate in that system. This ability may prevent the ion implantation system from malfunctioning or failing to operate according to specified parameters. Additionally, the use of ultrasonic additive manufacturing to weld metal over the identification feature in the component presents a serious detriment to those that may attempt to produce non-sanctioned replacement parts for the ion implantation system. Second, the ability to determine the components that make up the ion implantation system may allow the controller to alter or modify parameters based on the identified components. This may reduce the possibility of human error during configuration.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes.

Accordingly, the claims set forth below should be construed in view of the full breadth and spirit of the present disclosure as described herein.

What is claimed is:

1. A component for use in an ion implantation system comprising:
    a cavity; and
    an identification feature;
    wherein the cavity comprises at least one passageway between an interior of the cavity and an exterior of the component, and wherein the identification feature is disposed in the cavity and a top of the cavity is sealed with metal strips.

2. The component of claim 1, wherein the identification feature is larger than the passageway in at least one dimension.

3. The component of claim 1, wherein the identification feature comprises an amplitude varying element, a frequency varying element or a phase varying element.

4. The component of claim 1, wherein the identification feature is adapted to receive a signal that is output by a signal source.

5. The component of claim 4, wherein the signal source is a light emitter.

6. The component of claim 4, wherein the signal is an analog voltage.

7. The component of claim 4, wherein the signal is a digital signal.

8. The component of claim 1, wherein the top of the cavity is sealed using ultrasonic additive manufacturing.

9. The component of claim 1, wherein the identification feature is a fiberoptic cable, a printed circuit board, an electrical circuit, one or more light emitters, one or more sensors, an electrical conduit or any combination of these elements.

10. The component of claim 1, wherein the component is selected from the group consisting of a flange, a gasket, an ion source, an extraction assembly, a platen, a turbo pump, a mass analyzer, a corrector magnet, an acceleration or deceleration stage, a resolving aperture, a liner, and a Faraday cup.

11. A component comprising:
    a cavity; and
    an identification feature disposed in the cavity;
    wherein a top of the cavity is sealed with metal strips; and
    wherein the identification feature is adapted to:
        receive a signal from a signal source;
        modify the signal; and
        transmit the modified signal.

12. The component of claim 11, wherein the signal comprises a light signal, and the identification feature modifies a frequency, phase or amplitude of the signal.

13. The component of claim 11, wherein the signal comprises an analog signal, and the identification feature modifies a frequency, phase or amplitude of the signal.

14. The component of claim 11, wherein the signal comprises a digital signal, and the identification feature modifies a frequency, duty cycle or phase of the signal.

15. The component of claim 11, wherein the signal comprises a digital signal, and the identification feature modifies the signal by appending a unique identification to the signal.

16. The component of claim 11, wherein the top of the cavity is sealed using ultrasonic additive manufacturing.

17. The component of claim 11, wherein the component is selected from the group consisting of a flange, a gasket, an ion source, an extraction assembly, a platen, a turbo pump, a mass analyzer, a corrector magnet, an acceleration or deceleration stage, a resolving aperture, a liner, and a Faraday cup.

* * * * *